(12) United States Patent
Mannen et al.

(10) Patent No.: US 9,362,151 B2
(45) Date of Patent: Jun. 7, 2016

(54) SUBSTRATE WARP CORRECTING DEVICE AND SUBSTRATE WARP CORRECTING METHOD

(71) Applicant: SHINKO ELECTRIC INDUSTRIES CO., LTD., Nagano-shi (JP)

(72) Inventors: Touru Mannen, Nagano (JP); Akira Kamijo, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 305 days.

(21) Appl. No.: 14/178,664

(22) Filed: Feb. 12, 2014

(65) Prior Publication Data

US 2014/0242729 A1 Aug. 28, 2014

(30) Foreign Application Priority Data

Feb. 27, 2013 (JP) ................................. 2013-036842
Dec. 24, 2013 (JP) ................................. 2013-264875

(51) Int. Cl.
| | |
|---|---|
| H01L 21/00 | (2006.01) |
| H01L 21/67 | (2006.01) |
| H01L 21/687 | (2006.01) |
| H05K 1/02 | (2006.01) |
| H05K 3/00 | (2006.01) |
| H05K 3/46 | (2006.01) |

(52) U.S. Cl.
CPC .... *H01L 21/67288* (2013.01); *H01L 21/68735* (2013.01); *H05K 1/0271* (2013.01); *H01L 2224/16225* (2013.01); *H01L 2224/32225* (2013.01); *H01L 2224/73204* (2013.01); *H01L 2924/3511* (2013.01); *H05K 3/007* (2013.01); *H05K 3/4644* (2013.01)

(58) Field of Classification Search
CPC ...................................................... H01L 21/00
See application file for complete search history.

(56) References Cited

FOREIGN PATENT DOCUMENTS

JP          2011-222578 A1     11/2011

*Primary Examiner* — Marvin Payen
(74) *Attorney, Agent, or Firm* — Kratz, Quintos & Hanson, LLP

(57) ABSTRACT

A substrate warp correcting device includes, a lower member including a concave portion, and the lower member on which a substrate is to be arranged, an upper member arranged above the lower member, and the upper member including a gas supplying hole, wherein the substrate is arranged between the lower member and the upper member and above the concave portion, and a sealing member arranged between a periphery part of the substrate and the upper member, and the sealing member sealing a space between the substrate and the upper member.

12 Claims, 20 Drawing Sheets

FIG. 1A
FIG. 1B
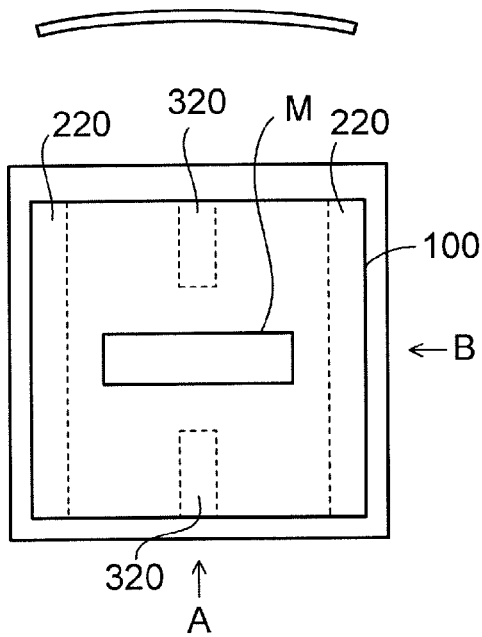
FIG. 1C
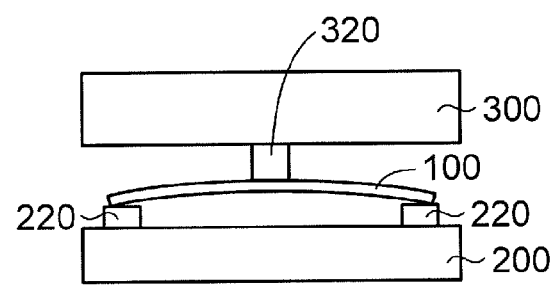
FIG. 1D
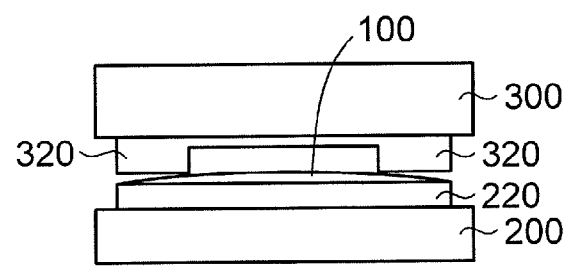
FIG. 1E
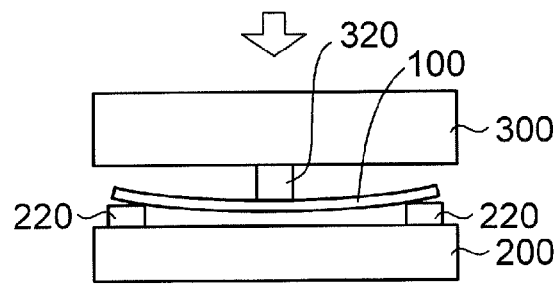

FIG. 9

| temperature (°C) | warp amount before correction (μm) | warp amount after correction (μm) | after re-heating (μm) | Δ(after correction − after re-heating) (μm) |
|---|---|---|---|---|
| room temperature | 20.73 | -17.67 | -20.24 | 2.57 |
| 30 | 20.73 | -18.15 | -21.11 | 2.96 |
| 40 | 20.78 | -17.76 | -21.12 | 3.36 |
| 50 | 21.46 | -20.38 | -24.09 | 3.71 |
| 60 | 21.49 | -21.06 | -23.14 | 2.08 |
| 70 | 21.5 | -23.39 | -23.63 | 0.24 |
| 80 | 21.54 | -28.35 | -29.35 | 1.00 |
| 90 | 21.61 | -27.09 | -25.51 | -1.58 |
| 100 | 21.69 | -38.11 | -33.17 | -4.94 |
| 110 | 21.76 | -51.03 | -39.97 | -11.06 |
| 120 | 21.8 | -68.18 | -52.33 | -15.85 |
| 130 | 21.87 | -116.5 | -89.72 | -26.81 |
| 140 | 20.7 | unmeasurable | -120.97 | |

FIG. 13

| processing time (sec) | sealing | | open | |
|---|---|---|---|---|
| | warp amount of before correction(μm) | warp amount of after correction(μm) | warp amount of before correction(μm) | warp amount of after correction(μm) |
| 1 | 15.65 | -20.85 | 16.77 | 14.2 |
| | 22.46 | -19.85 | 19.28 | 17.39 |
| | 22.46 | -18.79 | 24 | 20.86 |
| 5 | 15.67 | -23.84 | 16.88 | 14.91 |
| | 22.43 | -23.93 | 19.23 | 17.17 |
| | 22.47 | -24.59 | 24 | 22.53 |
| 10 | 15.95 | -29.58 | 17.17 | 15.02 |
| | 22.43 | -27.87 | 19.18 | 17.54 |
| | 22.49 | -19.66 | 24.01 | 22.02 |

SUBSTRATE WARP CORRECTING DEVICE AND SUBSTRATE WARP CORRECTING METHOD

CROSS-REFERENCE TO RELATED APPLICATIONS

This application is based upon and claims the benefit of priority of the prior Japanese Patent Application No. 2013-036842, filed on Feb. 27, 2013, and the prior Japanese Patent Application No. 2013-264875, filed on Dec. 24, 2013, the entire contents of which are incorporated herein by reference.

FIELD

This invention is related to a substrate warp correcting device and a substrate warp correcting method.

BACKGROUND

In the prior art, there are wiring substrates for mounting semiconductor chips or the like. In such wiring substrates, bump electrodes of the semiconductor chip are flip-chip connected to connection pads of the wiring substrate.

In the case that a direction of a warp of the semiconductor chip is different from a direction of a warp of the wiring substrate, the semiconductor chip cannot be flip-chip connected to the wiring substrate reliably. Therefore, it is necessary to correct the warp of the wiring substrate.

A related art is disclosed in Japanese Laid-open Patent Publication No. 2011-222578.

SUMMARY

As explained in the column of preliminary matter described later, there is a method in which a wiring substrate warped in a convex shape is pressed with punches to correct the warp. In this method, in the case that the chip mounting region of the wiring substrate is large, or the like, since the regions to be pressed by the punches are limited to end parts of the wiring substrate, it is difficult to correct the warp of the wiring substrate sufficiently.

According to one aspect discussed herein, there is provided a substrate warp correcting device, including a lower member including a concave portion, and the lower member on which a substrate is to be arranged, an upper member arranged above the lower member, and the upper member including a gas supplying hole, wherein the substrate is arranged between the lower member and the upper member and above the concave portion, and a sealing member arranged between a periphery part of the substrate and the upper member, and the sealing member sealing a space between the substrate and the upper member.

According to another aspect discussed herein, there is provided a substrate warp correcting method, including preparing a lower member including a concave portion, preparing an upper member including a gas supplying hole, wherein a substrate is arranged between the lower member and the upper member and above the concave portion, and arranging a sealing member on a periphery part of the substrate, and arranging the upper member above the lower member through the sealing member, and supplying gas to the substrate from the gas supplying hole.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 1A to 1E are cross-sectional views depicting a state that a warp of a wiring substrate is corrected according to a preliminary matter (Part 1).

FIG. 9 is a table depicting dependency between temperatures and the warp amount of wiring substrates before correction, after correction, and after re-heating.

FIG. 13 is a table depicting a comparison of the effect of warp correction of the wiring substrate between the substrate warp correcting device of the embodiment and the substrate warp correcting device of the comparative example.

DESCRIPTION OF EMBODIMENT

Figure 2A:
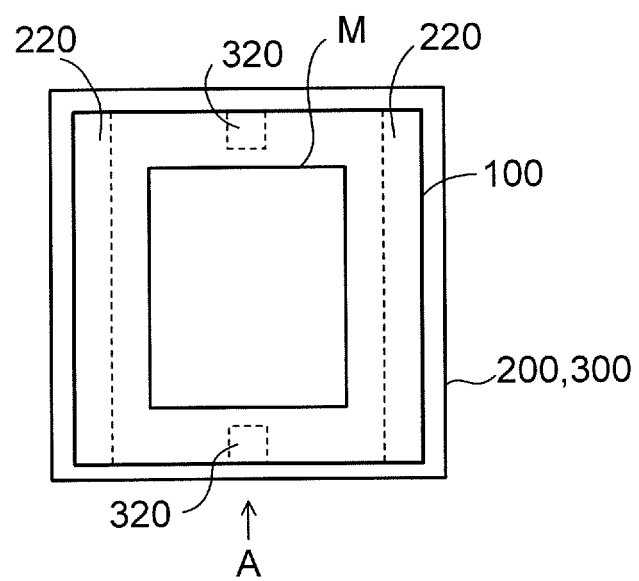
FIGS. 2A and 2B are cross-sectional views depicting a state that a warp of a wiring substrate is corrected according to the preliminary matter (Part 2).

Hereinbelow, an embodiment will be described with reference to the accompanying drawings.

Before explaining the embodiment, a preliminary matter that forms the basis will be explained. As depicted in FIG. 1A, in a wiring substrate 100, a warp in a convex shape is generated due to the influence of a heating process in the manufacturing thereof or the like.

In the case that the warp in a concave shape is generated in a semiconductor chip which is to be mounted, when the warp in the convex shape is generated in the wiring substrate 100, the semiconductor chip cannot be flip-chip connected on the wiring substrate 100 reliably. Therefore, it is necessary to correct the warp of the wiring substrate 100.

FIGS. 1B to 1D are views depicting a state that the wiring substrate 100 in FIG. 1A is arranged in a warp correcting device. FIG. 1B is a plan view, FIG. 1C is a side view of FIG. 1B as seen from a direction A, and FIG. 1D is a side view of FIG. 1B as seen from a direction B.

As depicted in FIGS. 1B to 1D, the warp correcting device includes a lower member 200 and an upper member 300. The lower member 200 includes substrate receiving portions 220 which are arranged to be opposed to both end sides. The wiring substrate 100 in FIG. 1A is arranged on the substrate receiving portions 220 of the lower member 200. As depicted in FIG. 1B, the wiring substrate 100 has a chip mounting region M in a center part thereof.

Focusing on FIGS. 1B and 1D, the upper member 300 includes punches 320 on both end parts of the lower face thereof. The punches 320 are arranged at positions corresponding to the both end parts of the wiring substrate 100.

Then, as depicted in FIG. 1E, the wiring substrate 100 is pressed downward by the punches 320 of the upper member 300. By this matter, the warp of the wiring substrate 100 is corrected so that the wiring substrate 100 is in a flat or concave shape.

At this time, when the wiring substrate 100 is pressed by the punches 320 of the upper member 300, it is necessary to press regions of the wiring substrate 100 to avoid the chip mounting region M so as not to damage the chip mounting region M.

Like the example of FIGS. 1B to 1E, in the case that the chip mounting region M of the wiring substrate 100 is small, the pressing regions of the wiring substrate 100 are not limited relatively. For this reason, the punches 320 of the upper member 300 can press the wide regions of the wiring substrate 100 extending from the end side to the inner side thereof. Accordingly, the warp can be corrected sufficiently.

Figure 2B:
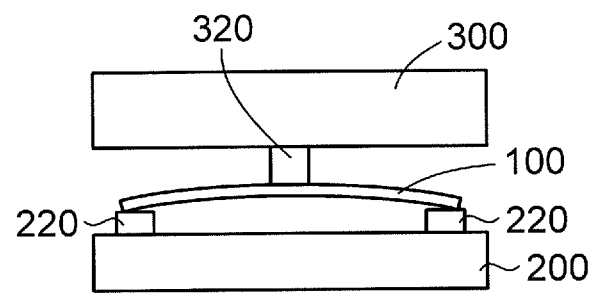

FIGS. 2A and 2B depict a case of correcting the warp of a wiring substrate 100 having a large chip mounting region M in a center main part thereof. Like FIGS. 1B and 1C, FIG. 2A is a plan view, and FIG. 2B is a side view of FIG. 2A as seen from the direction A.

As depicted in FIGS. 2A and 2B, in the case that the chip mounting region M of the wiring substrate 100 is large, the regions of the wiring substrate 100 to be pressed by the punches 320 of the upper member 300 are limited to the end parts. For this reason, the wiring substrate 100 cannot be pressed sufficiently. Accordingly, the warp cannot be corrected sufficiently.

Figure 3A:
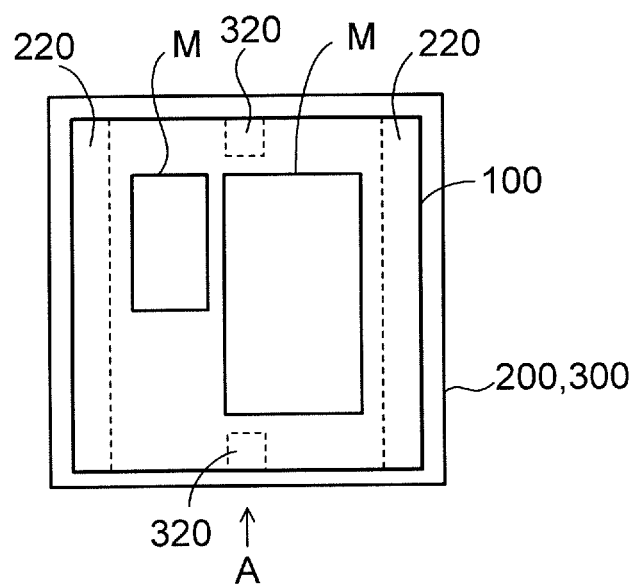
FIGS. 3A and 3B are cross-sectional views depicting a state that a warp of a wiring substrate is corrected according to the preliminary matter (Part 3).
Figure 3B:
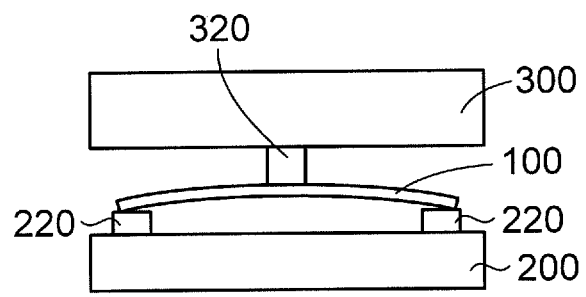

Moreover, FIGS. 3A and 3B depict a case of correcting the warp of a wiring substrate 100 having two chip mounting regions M in a center main part thereof. Like FIGS. 1B and 1C, FIG. 3A is a plan view, and FIG. 3B is a side view of FIG. 3A as seen from the direction A.

As depicted in FIGS. 3A and 3B, in the case that the wiring substrate 100 has two chip mounting regions M as well, the regions of the wiring substrate 100 to be pressed by the punches 320 of the upper member 300 are limited to end parts, depending upon the sizes of and the positional relation between those chip mounting regions M. For this reason, likewise, the warp of the wiring substrate 100 cannot be corrected sufficiently.

The embodiment to be explained below can solve the problem mentioned above.

First Embodiment

Figure 4:
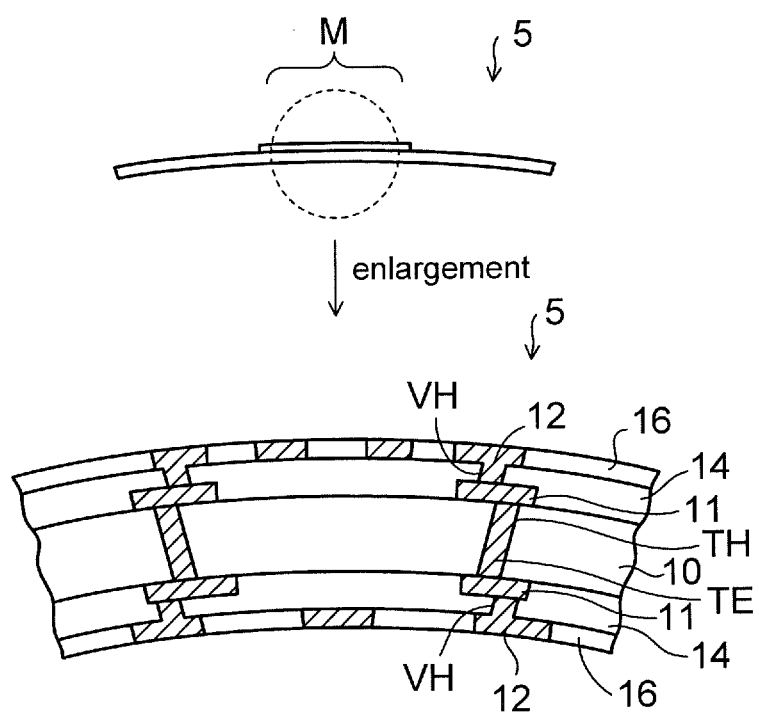
FIG. 4 is a cross-sectional view depicting an example of a wiring substrate that the warp is to be corrected.
Figure 5:
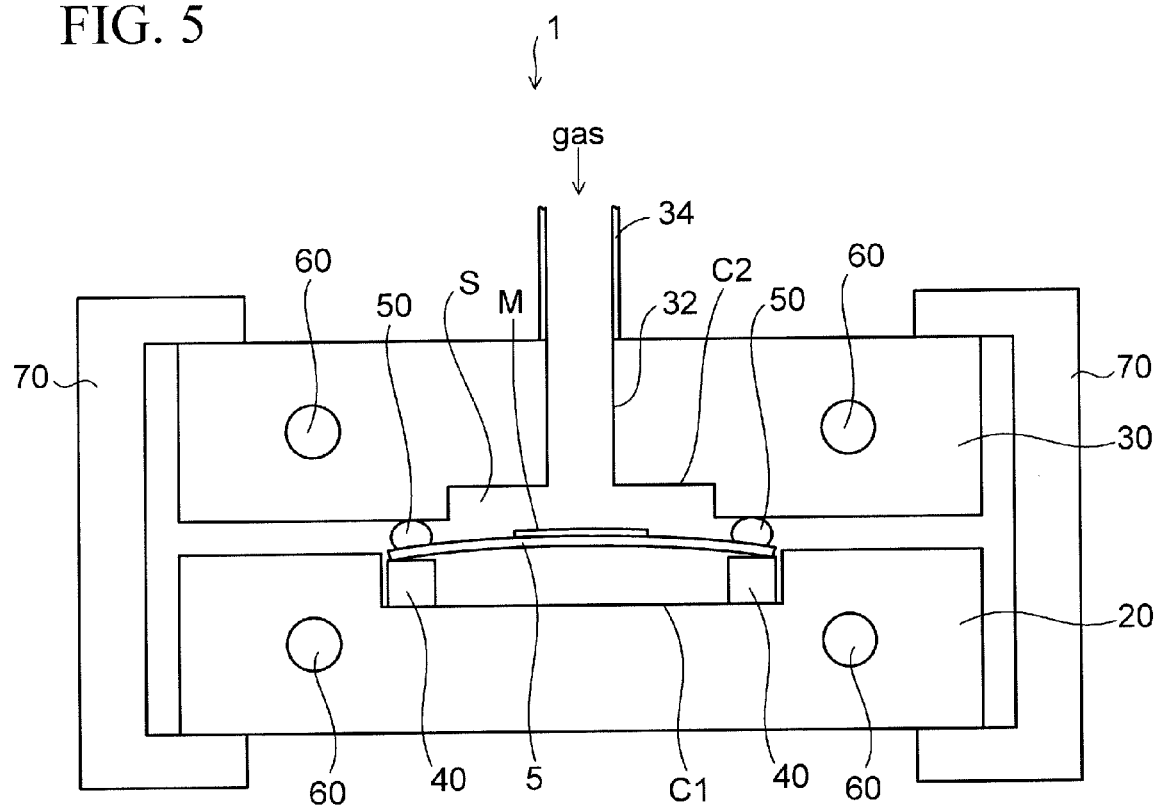
FIG. 5 is a cross-sectional view depicting a substrate warp correcting device of a first embodiment.
Figure 6:
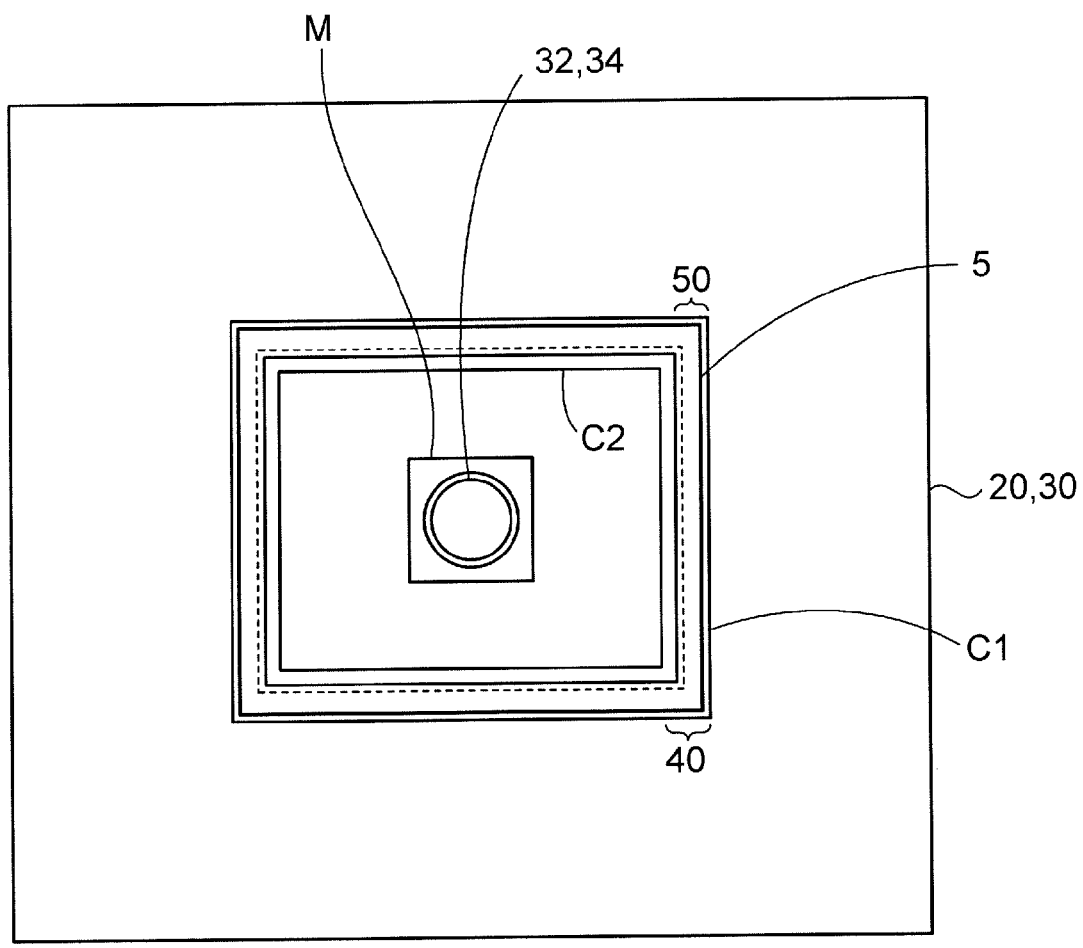
FIG. 6 is a plan view of a lower member and an upper member in FIG. 5 as seen from above in a perspective view.

FIG. 4 is a cross-sectional view depicting an example of a wiring substrate that the warp is to be corrected according to a first embodiment. FIG. 5 is a cross-sectional view depicting a substrate warp correcting device of the first embodiment. FIG. 6 is a plan view of a lower member and an upper member of the warp correcting device in FIG. 5 as seen from above in a perspective view.

As depicted in FIG. 4, a wiring substrate 5 used in the first embodiment has a chip mounting region M on the upper face side thereof and has a quadrangle shape in a plan view. Then, a warp in a convex shape is generated in the wiring substrate 5 all over. As depicted in the partially enlarged view in FIG. 4, the wiring substrate 5 includes a core substrate 10 formed of glass epoxy resin or the like in a center part of the thickness direction thereof.

Through-holes TH penetrating in the thickness direction are provided in the core substrate 10, and a penetrating electrode TE is formed in each through-hole TH. First wiring layers 11 are formed on both faces of the core substrate 10, respectively, and connected to each other through the penetrating electrode TE.

Note that, the first wiring layers 11 on both sides may be connected to each other by a through-hole plating layer formed on the sidewall of each through-hole TH in the core substrate 10, and resin may be filled in the remaining hole part of the through-hole TH.

Moreover, interlayer insulating layers 14 are formed on both sides of the core substrate 10, respectively, and the interlayer insulating layers 14 in which via holes VH reaching the first wiring layers 11 are provided. Further, second wiring layers 12 are formed on the interlayer insulating layers 14 on both sides, respectively, and connected to the first wiring layers 11 through a via conductor in each via hole VH.

Moreover, solder resists 16 are formed on the interlayer insulating layers 14 on both sides, respectively, and connecting parts of the second wiring layers 12 are exposed from the solder resists 16. In the example of FIG. 4, the two layers of the first and second wiring layers 11, 12 are formed on both sides of the core substrate 10. However, the number of laminated layers can be set to any suitable number.

A coreless wiring substrate having no core substrate may be used as the wiring substrate.

In the wiring substrate 5A, a semiconductor chip is to be flip-chip connected to the second wiring layer 12 in the chip mounting region M thereof.

When the step of forming the interlayer insulating layer 14 by attaching a resin film onto the core substrate 10 and performing a heating process, or the like is repeated, the core substrate 10 cannot withstand the thermal stress generated in the inside, thereby the warp is generated in the wiring substrate 5 easily.

When the warp in a convex shape is generated in the wiring substrate 5, it is difficult to flip-chip connect a semiconductor chip warped in a concave shape on the wiring substrate 5 reliably. Thus, it is necessary to correct the warp of the wiring substrate 5.

Next, the substrate warp correcting device of the first embodiment will be explained. As depicted in the cross-sectional view of FIG. 5, a substrate warp correcting device 1 of the first embodiment includes a lower member 20 and an upper member 30 arranged thereon.

Referring to add the perspective plan view of FIG. 6, a quadrangle concave portion C1 is formed in a center part of the upper face side of the lower member 20. Moreover, the substrate warp correcting device 1 includes an annular spacer 40 arranged on the periphery part of the concave portion C1 of the lower member 20.

The lower member 20 and the upper member 30 are formed of a metal such as steel, for example. The spacer 40 is formed of stainless steel, for example.

Then, the periphery part of the wiring substrate 5 in FIG. 4 mentioned above is arranged on the spacer 40. The spacers 40 of different sizes may be prepared so as to correspond to the sizes of various types of wiring substrates 5. By this matter, it is possible to easily correspond to various types of wiring substrates 5 by changing the spacer 40. The concave portion C1 of the lower member 20 is formed such that its size corresponds to the area of the largest wiring substrate.

The upper member 30 includes a concave portion C2 provided in a center part of the lower face side thereof. The concave portion C2 of the upper member 30 is arranged in a region corresponding to a main part of the wiring substrate 5. Moreover, the upper member 30 includes a gas supplying hole 32 penetrating to the thickness direction in a center part thereof.

The gas supplying hole 32 of the upper member 30 is connected to be communicated with a center part of the concave portion C2 on the lower face side. A gas pipe 34 is attached to the gas supplying hole 32 of the upper member 30, and gas is supplied from a gas compressor (not depicted) at a predetermined pressure.

For example, when the area of the lower member 20 and the upper member 30 is 3 cm×3 cm, the diameter of the gas supplying hole 32 is about 3 mm to 5 mm.

Moreover, an annular sealing member 50 is arranged on the periphery part of the wiring substrate 5 arranged on the spacer 40. Then, the upper member 30 is arranged on the lower member 20 through the sealing member 50 which is arranged on the periphery part on the wiring substrate 5.

Meanwhile, as depicted in the example of FIG. 5, the upper member 30 and the lower member 20 may be fixed with a clamping jig 70 or the like.

The sealing member 50 is formed of an elastic material that can adhere to the wiring substrate 5 and the upper member 30 with no gap therebetween when the lower member 20 and the upper member 30 are made to adhere each other. A rubber packing formed of fluororubber or the like can be used as a preferable example of such sealing member 50.

Moreover, a heater 60 is provided in each of the lower member 20 and the upper member 30 and is capable of heating the wiring substrate 5 to a desired temperature. For example, an electrically-heated wire heater or the like is used as the heater 60.

Next, a method of correcting warp of the wiring substrate 5 will be explained. As depicted in FIG. 5, first, the wiring substrate 5 in which the warp in the convex shape is generated is arranged onto the spacer 40 arranged in the concave portion C1 of the lower member 20. By this matter, the wiring substrate 5 is arranged on the lower member 20 through the spacer 40 so as to cover the concave portion C1 of the lower member 20.

Thereafter, the sealing member 50 is arranged onto the periphery part of the wiring substrate 5, and the upper member 30 is arranged onto the lower member through the sealing member 50. Further, the end parts of the lower member 20 and the upper member 30 are clamped and fixed with the clamping jig 70.

By this matter, a gas supplying space S is formed by the wiring substrate 5, the sealing member 50, and the inner faces of the concave portion C2 of the upper member 30. The gas supplying space S is constituted as a sealed space from which no gas leaks by the function of the sealing member 50 when gas is supplied from the gas supplying hole 32.

Figure 7:
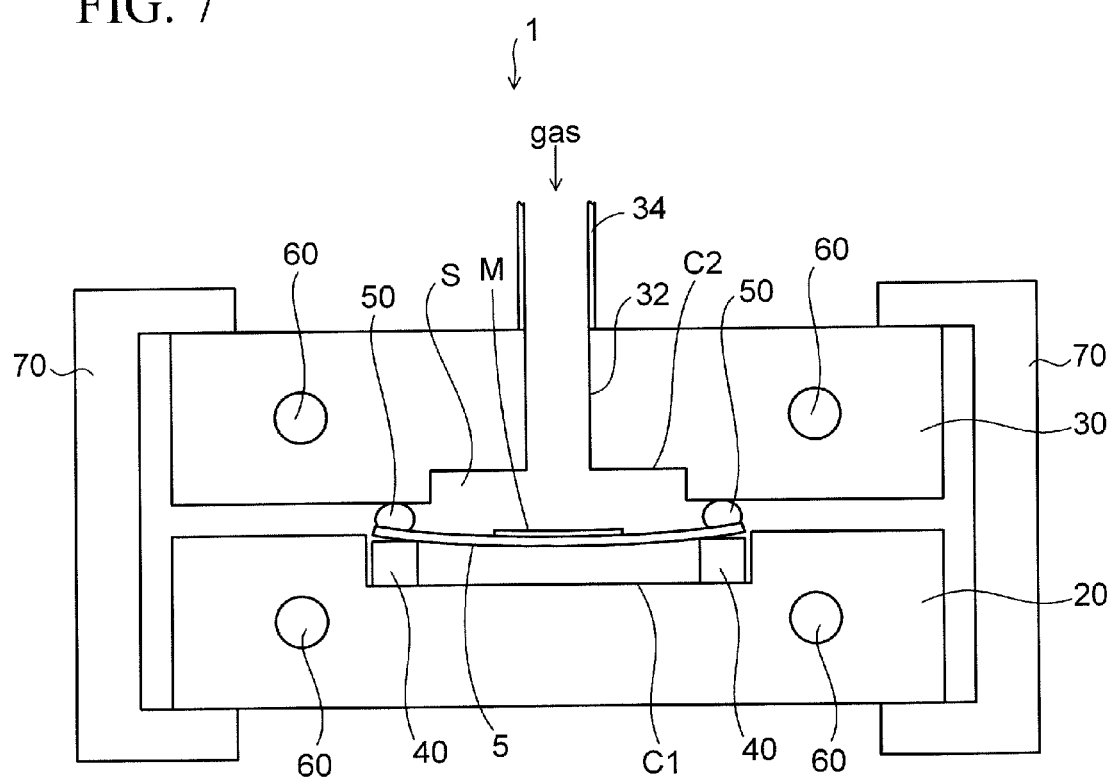
FIG. 7 is a cross-sectional view depicting a state that the warp of the wiring substrate is corrected by the substrate warp correcting device of the first embodiment.

Then, as depicted in FIG. 7, the gas is supplied at a predetermined pressure from the gas supplying hole 32 in the upper member 30 into the gas supplying space S. Thus, the wiring substrate 5 warped in the convex shape is pressed downward and deformed by using the pressure of the gas. As the gas, air is preferably used, but an inert gas such as nitrogen ($N_2$) gas, oxygen ($O_2$) gas, or argon (Ar) gas may be used instead.

At this time, since the gas supplying space S is constituted as the sealed space from which no gas leaks by the function of the sealing member 50, the pressing force can be applied efficiently to the wiring substrate 5. By this matter, the wiring substrate 5 which is warped in the convex shape is corrected to a flat or concave shape. The wiring substrate 5 in the region inside the spacer 40 is bended downward by the pressing force of the gas, the warp of the wiring substrate 5 is corrected.

In this way, in this embodiment, the wiring substrate 5 arranged on the spacer 40 is fixed by the upper member 30 through the sealing member 50, and the gas is supplied from the gas supplying hole 32 in the upper member 30 to press the wiring substrate 5 downward.

For this reason, unlike the method of pressing by the punches as explained in the preliminary matter, the size and the arranged position of the chip mounting region M of the wiring substrate 5 do not need to be taken into consideration, and the pressing region of the wiring substrate 5 is not limited. Accordingly, it is possible to easily correct the warp of the wiring substrates of various specifications.

Moreover, even if the warp amount of the wiring substrate is large, the warp of the wiring substrate can be corrected easily by adjusting the pressure of the gas.

Note that, although it is preferable to form the concave portion C2 on the lower face side of the upper member 30 so as to secure a sufficient gap between the wiring substrate 5 and the upper member 30, it is possible to omit the concave portion C2 of the upper member 30. In this case, the sealing member 50 having a large diameter is used, thus the arrangement height of the upper member 30 is raised, by this matter, the condition that the wiring substrate 5 and the upper member 30 cannot contact may be kept.

Figure 8:
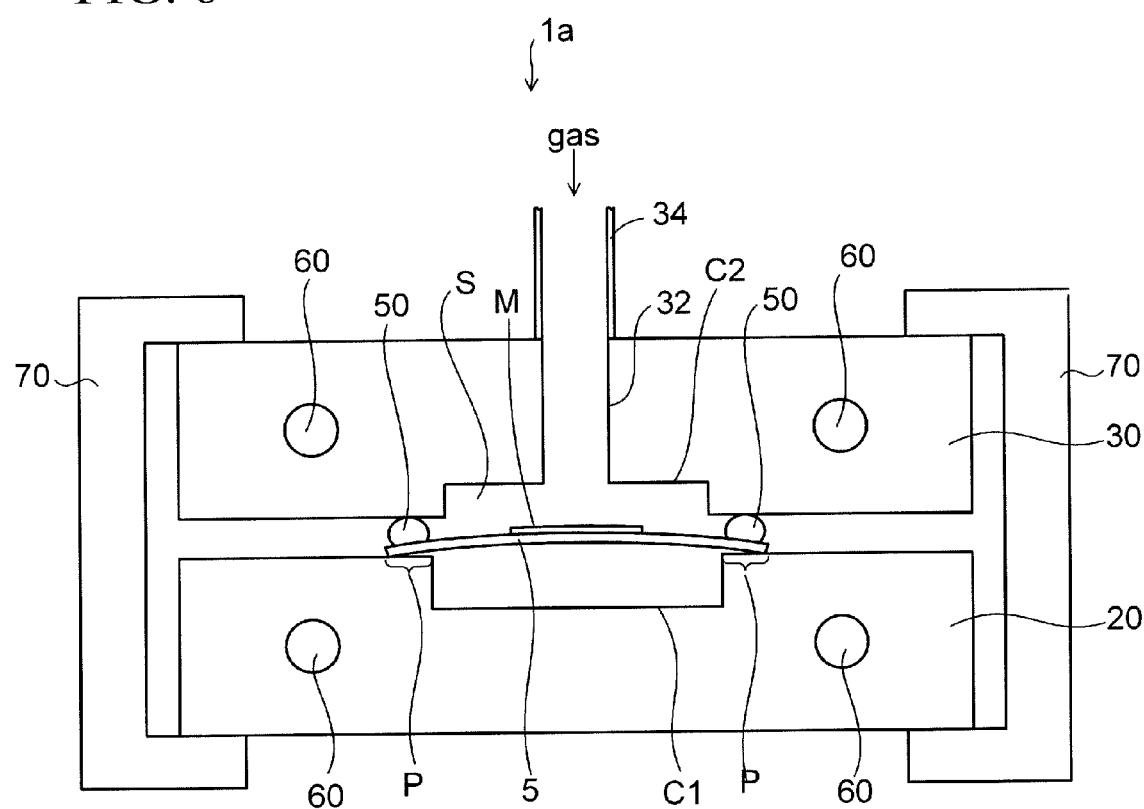
FIG. 8 is a cross-sectional view depicting a substrate warp correcting device of a modification of the embodiment.

FIG. 8 depicts a substrate warp correcting device 1a of a modification of the embodiment. Like the substrate warp correcting device 1a of the modification in FIG. 8, in the case that only the wiring substrates 5 having the same size are to be processed, the spacer 40 may be omitted in FIG. 5 mentioned above.

In this case, the periphery part of the wiring substrate 5 is arranged on an outer region P of the concave portion C1 of the lower member 20. In this way, in the example of FIG. 8, the wiring substrate 5 is arranged directly on the lower member 20 so as to cover the concave portion C1 of the lower member 20.

Then, the upper member 30 is arranged on the lower member 20 through the sealing member 50 which is arranged on the periphery part of the wiring substrate 5, and the lower member 20 and the upper member 30 are fixed with the clamping jig 70.

In the case of the substrate warp correcting device 1a of the modification as well, the warp of the wiring substrate 5 can be corrected in a similar way by supplying the gas from the gas supplying hole 32 to thereby press the wiring substrate 5 downward.

Note that, in each of the substrate warp correcting devices 1, 1a in FIGS. 5 and 8, a similar gas supplying hole may be formed in the lower member 30 as well. Further, in FIG. 5, the sealing member 50 may be arranged not only between the wiring substrate 5 and the upper member 30 but also between the spacer 40 and the wiring substrate 5. Furthermore, in FIG. 8, the sealing member 50 may be arranged not only between the wiring substrate 5 and the upper member 30 but also between the lower member 20 and the wiring substrate 5.

In the case that the spacer 40 and the wiring substrate 5 are adhered through the sealing member 50, the metal is all right as the material of the spacer 40. On the other hand, the spacer 40 and the wiring substrate 5 directly contact, a soft material such as resins is used as the material of the spacer 40.

The inventor of the present application experimented as to the temperature dependency of the warp amount of the wiring substrate, in the method of correcting the warp of the wiring substrate by the substrate warp correcting device 1 described above.

The temperature of the wiring substrates is changed at room temperature (15° C.), and at interval of 10° C. in 30° C. to 140° C. respectively, and the warp amount of the chip mounting region of each wiring substrate was examined before correction, after correction, and after re-heating. The re-heating is a process assumed as reflow heating to be performed when the semiconductor chip is to be flip-chip connected to the chip mounting region of the wiring substrate, and the heating temperature of the re-heating was set to 250° C.

The wiring substrates each having a core substrate applied to BGA (Ball Grid Array) type were used as the evaluation substrate. As for the number of samples, one piece was used for each condition.

Moreover, in each condition, the pressure of the gas was set to 0.5 Mpa, and the processing time was set to 1 second.

Figure 10:
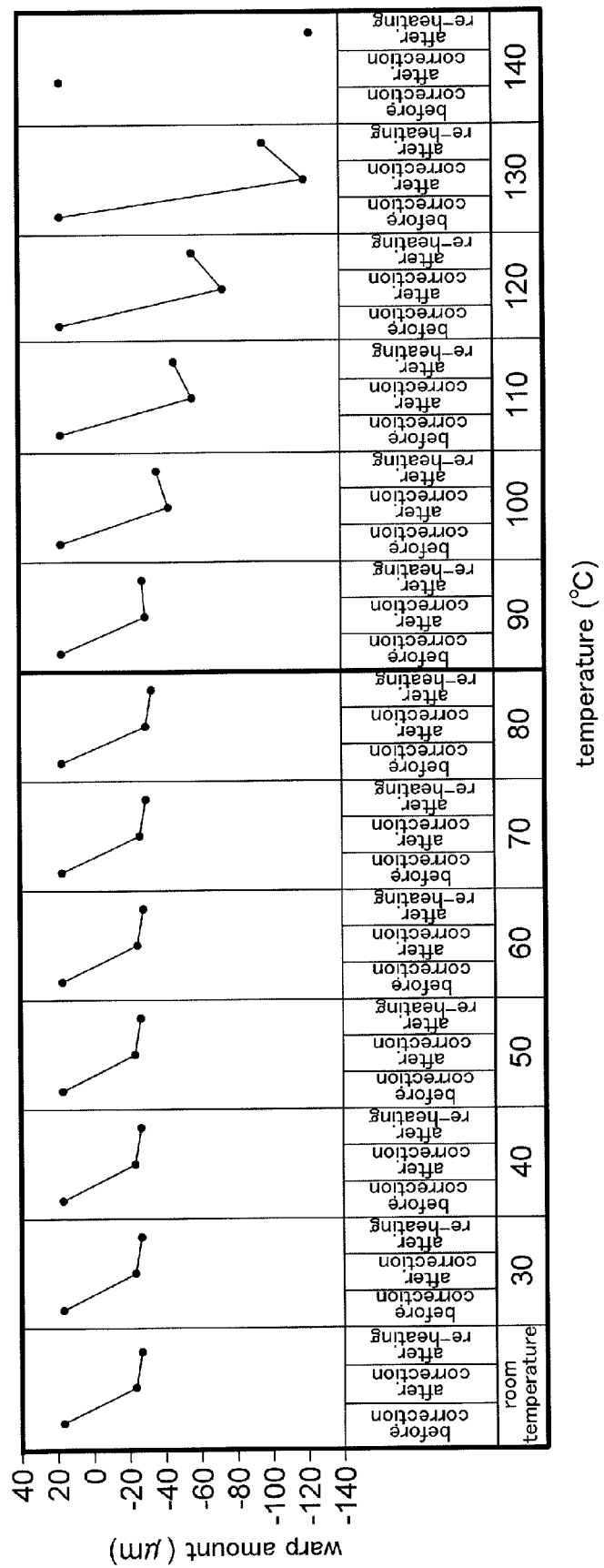
FIG. 10 is a graphical presentation of the respective data of warp amount of the wiring substrates in FIG. 9.
Figure 11:
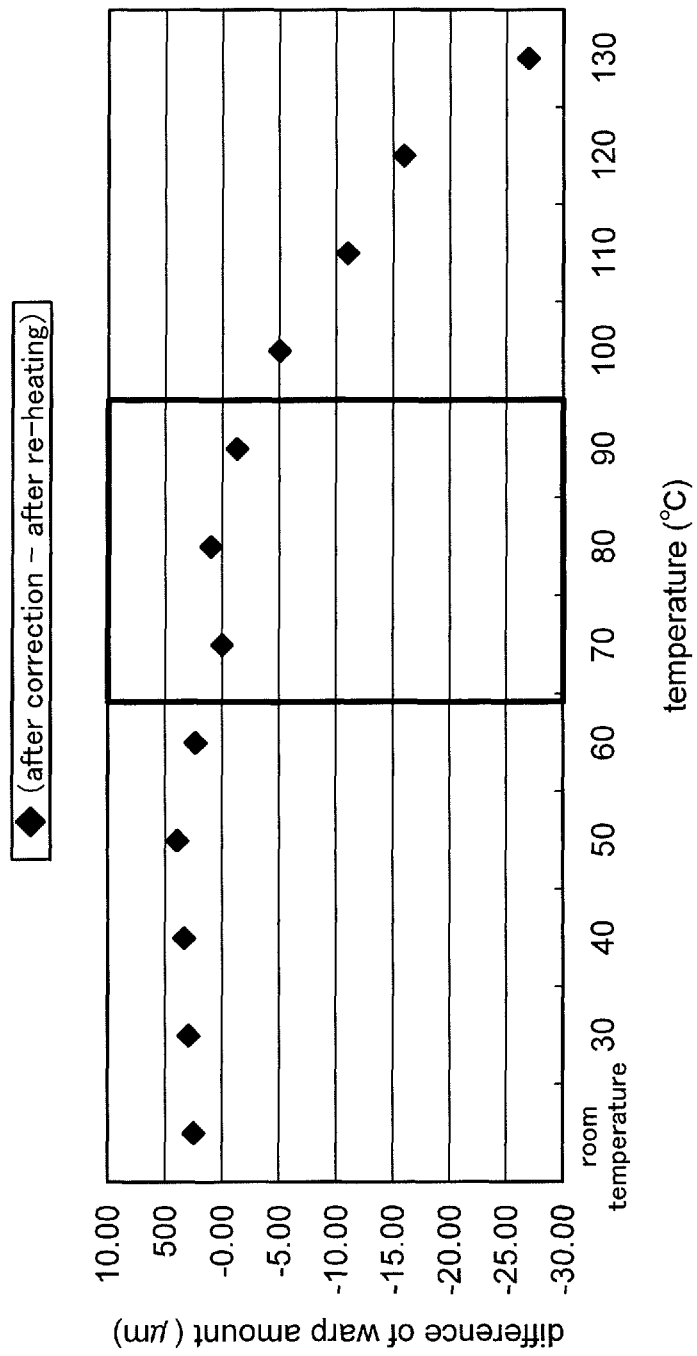
FIG. 11 is a graphical presentation of the difference between the warp amount after correction and the warp amount after re-heating in the data of the warp amount of the wiring substrates in FIG. 9.

The results are depicted in FIGS. 9 to 11. FIG. 10 is graphical presentation of the warp amounts before correction, after correction, and after re-heating in the date of the warp amount at each temperature in FIG. 9. Moreover, FIG. 11 is graphical presentation of values of the difference of the warp amount which is calculated from the formula "(the warp amount before correction)−(the warp amount after re-heating)", in the data of the warp amount at the each temperature in FIG. 9

When the warp amount of the wiring substrate is a positive value, it means that the wiring substrate is warped in the convex shape. On the other hand, when the warp amount is a negative value, it means that the wiring substrate is warped in the concave shape.

As depicted in FIGS. 9 and 10, the warp amount of each wiring substrate before correction is about 20 μm to 22 μm and the warp in the convex shape was generated. On the other hand, after the wiring substrate was processed by the warp correcting device 1 in FIG. 5 mentioned above, the warp amount of the wiring substrate is made to a negative value in all of each temperature, thus it was confirmed that the convex warp was corrected to the concave warp.

Moreover, it was found that as the temperature of the wiring substrate is raised gradually from the room temperature to 140° C., the absolute value of the negative value becomes large and therefore the warp is corrected largely toward the concave direction.

Moreover, when focusing on the warp amount of each wiring substrate after re-heating, in a temperature range of room temperature to 80° C., as compared with after correction, the absolute value of the negative value after re-heating is greater than the value after correction. From this, it is found that in the temperature range from room temperature to 80° C., when the re-heating is performed after correction, the wiring substrate is further warped toward the concave direction and the concave warp does not return to the convex warp. It is easy to understand this matter when referring to add the data from room temperature to 80° C. in the graph of FIG. 10.

On the other hand, in a temperature range from 90° C. to 130° C., as compared with after correction, the absolute value of the negative value after re-heating is smaller than the value after correction. This indicates that the concave shape after correction is somewhat returned to the convex direction. It is easy to understand this matter when referring to add the data from 90° C. to 130° C. in the graph of FIG. 10.

Moreover, referring to FIG. 11, as depicted by the data surrounded with a thick line, it is found that the amount of the change in the warp amount from after correction to after re-heating becomes the minimum value within a temperature range of 70° C. to 90° C.

Since the semiconductor chip is warped in the concave shape, it is necessary that the warp shape within the chip mounting region of the wiring substrate in the condition before the semiconductor chip is flip-chip connected is the concave shape. From the view of this, the preset temperature of the wiring substrate is preferably within a temperature range of room temperature to 90° C.

Moreover, when focusing in the amount of the change in the warp amount from after correction to after re-heating, the amount of the change becomes the minimum value within the temperature range of 70° C. to 90° C., and therefore this temperature range is preferable. This is because the reliability of connection of the semiconductor chip cannot be secured if the warp of the wiring substrate is greatly returned toward the convex direction after the semiconductor chip is mounted.

Moreover, the warp of the wiring substrate can be corrected sufficiently in the room temperature (15° C.) as well. In this case, the heaters 60 can be omitted from the substrate warp correcting device 1 in FIG. 5. Thus, the configuration of the warp correcting device can be simplified.

Also, the inventor of the present application examined to compare the correcting effect between the case that the warp of the wiring substrate is corrected in the sealed space as in FIG. 5 mentioned above and the case that the warp is corrected in the open state as comparative example.

Figure 12:
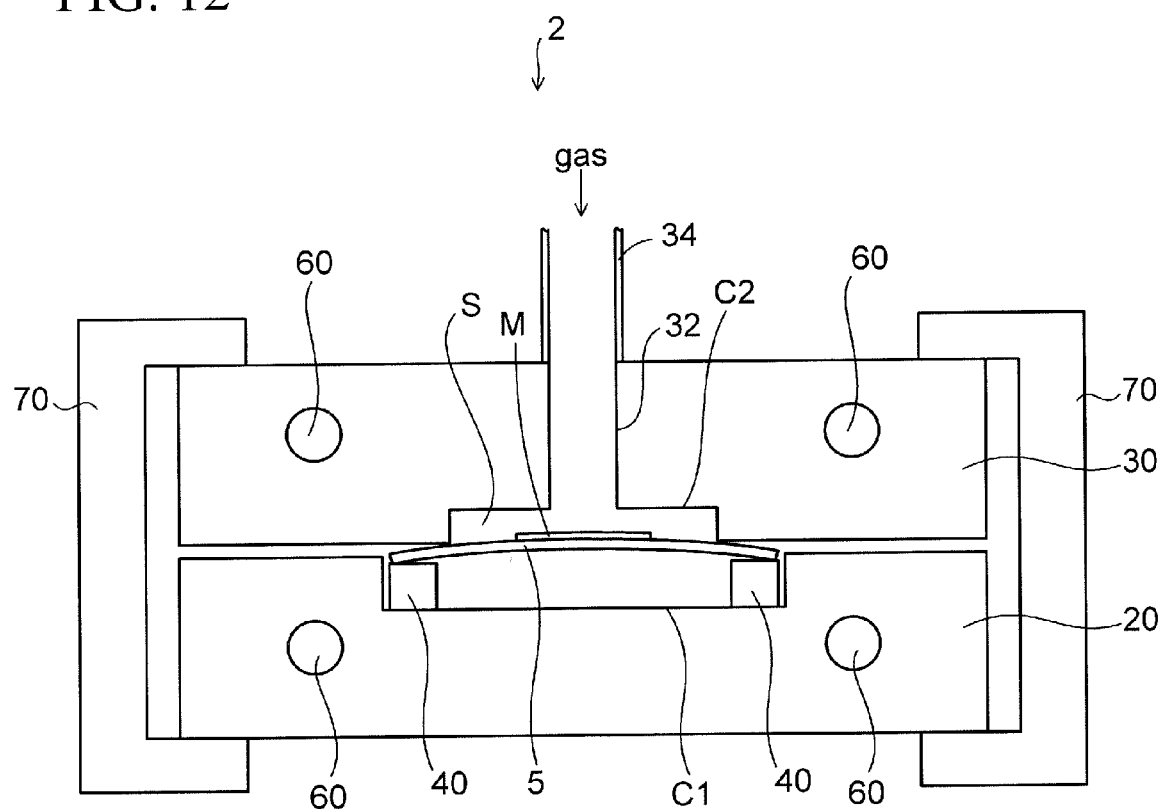
FIG. 12 is a cross-sectional view depicting a substrate warp correcting device of a comparative example.

As depicted in FIG. 12, in a substrate warp correcting device 2 of the comparative example, the sealing member 50 is omitted in the substrate warp correcting device 1 in FIG. 5, and the structure is employed in which the outer region of the concave portion C2 of the upper member 30 contacts directly the periphery part of the wiring substrate 5. The other elements in FIG. 12 are the same as those in FIG. 5.

The number of sample of the evaluation substrate was three pieces in each condition. The processing time was changed at 1 second, 5 seconds, and 10 seconds in each condition, respectively. Moreover, the pressure of the gas was set to 0.5 Mpa in each condition.

Figure 14:
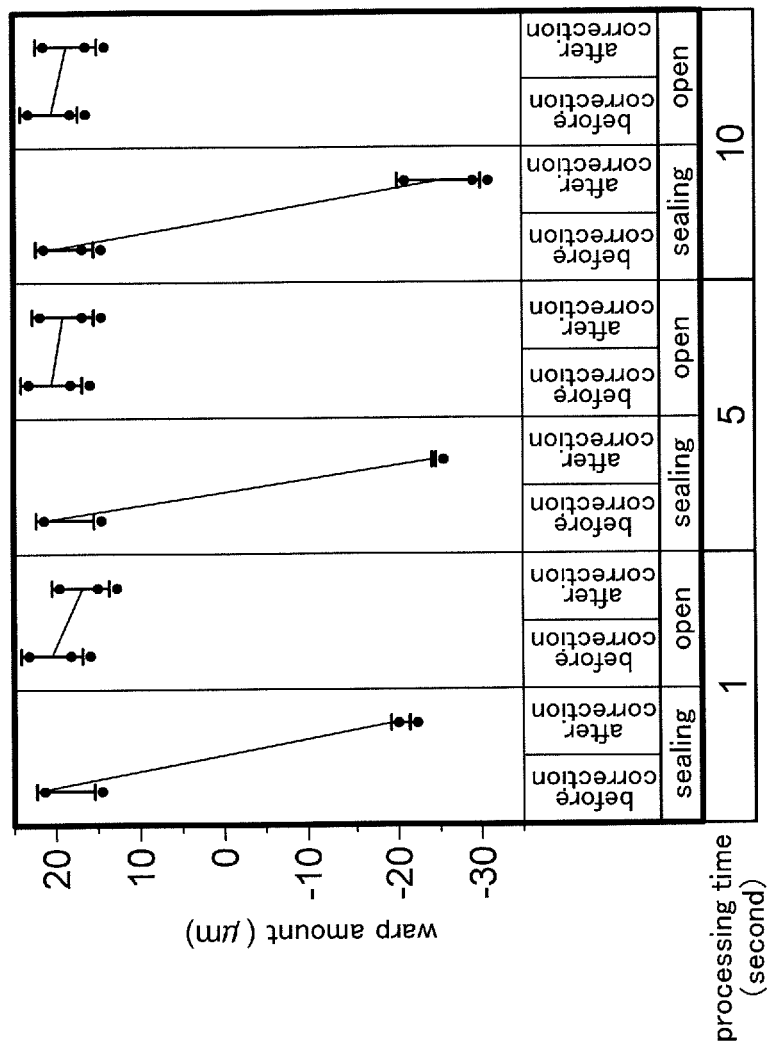
FIG. 14 is graphical presentation of each data of the warp amount of the wiring substrates in FIG. 13.

The results are depicted in FIGS. 13 and 14. FIG. 14 is graphical presentation of the data before correction and after correction in the data of the warp amount in FIG. 13.

As depicted in FIGS. 13 and 14, in the case that warp correction was performed in the sealed space as in the case of the substrate warp correcting device in FIG. 5, the warp amount which had the positive value before correction is changed to the warp amount of the negative value in all the conditions, thus the sufficient warp correcting effect was obtained like the examination results mentioned above. Specifically, the warp amount before correction was about 15 µm to 23 µm, and after correction the warp was corrected to about −18 µm to −30 µm.

On the other hand, in the case that the warp correction was performed in the open state as in the case of the substrate warp correcting device 2 of the comparative example in FIG. 12, the warp amount which had the positive value before correction is decreased only slightly, thus the sufficient warp correcting effect could not be obtained. Specifically, the warp amount before correction was about 16 µm to 24 µm and the warp amount after correction was about 14 µm to 23 µm, and only a slight warp correcting effect was obtained.

In the substrate warp correcting device 2 of the comparative example in FIG. 11, the sealing member 50 is omitted. Therefore, it is because that when the gas is supplied to press the wiring substrate 5, the gas leaks from a minute gap between the wiring substrate 5 and the upper member 30, thereby the wiring substrate 5 cannot be pressed sufficiently.

In this way, it is necessary to press the wiring substrate 5 with the gas in a state that the gas supplying space S is sealed by using the sealing member as in the case of the substrate warp correcting device 1 in FIG. 5.

Figure 15:
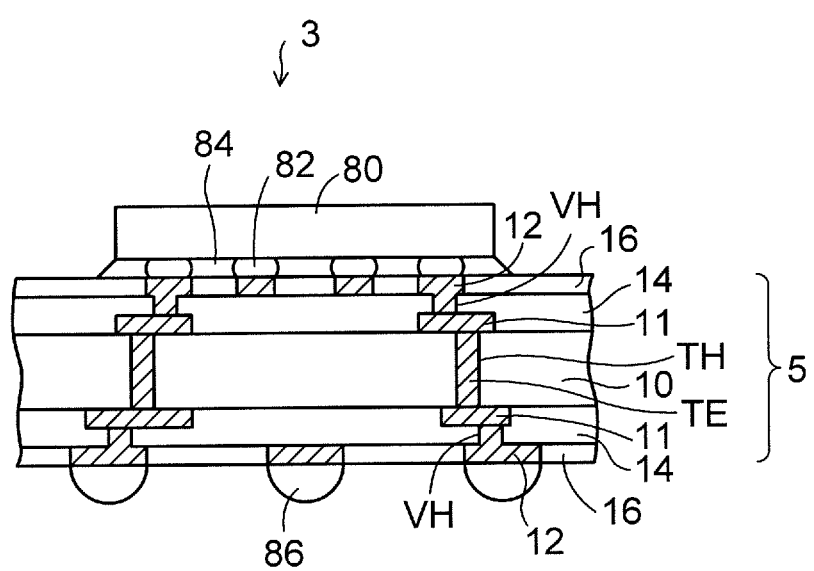
FIG. 15 is a cross-sectional view depicting a semiconductor device in which a semiconductor chip is mounted on the wiring substrate that the warp is corrected.

As described above, the wiring substrate 5 warped in the convex shape can be corrected so as to be flat or warped in the concave shape. Then, as depicted in FIG. 15, solder bumps 82 of a semiconductor chip 80 are arranged onto the second wiring layer 12 in the chip mounting region M of the wiring substrate 5 and the reflow heating is performed at a temperature of 230° C. to 250° C. By this matter, the solder bumps 82 of the semiconductor chip 80 are flip-chip connected to the wiring substrate 5.

At this time, as mentioned above, the semiconductor chip 80 is warped in the concave shape, and therefore it is necessary that the wiring substrate 5 is corrected so as to be warped in the concave shape. By doing so, the semiconductor chip 80 can be flip-chip connected to the wiring substrate 5 more reliably.

Thereafter, underfill resin 84 is filled in the gap between the semiconductor chip 80 and the wiring substrate 5. Further, external connection terminals 86 are formed on the second wiring layer 12 on the lower face side of the wiring substrate 5 by, for example, mounting solder balls. By this matter, a semiconductor device 3 is manufactured.

As mentioned above, even if the reflow heating as the re-heating is performed when the semiconductor chip 80 is flip-chip connected, the wiring substrate 5 warped in the concave shape after correction is not returned to the convex warp. Therefore, the high reliability of the semiconductor device 3 can obtained.

Although the first embodiment has given the example of correcting the warp of the wiring substrate 5, it is possible to correct warp of various types of substrates.

Second Embodiment

Figure 16:
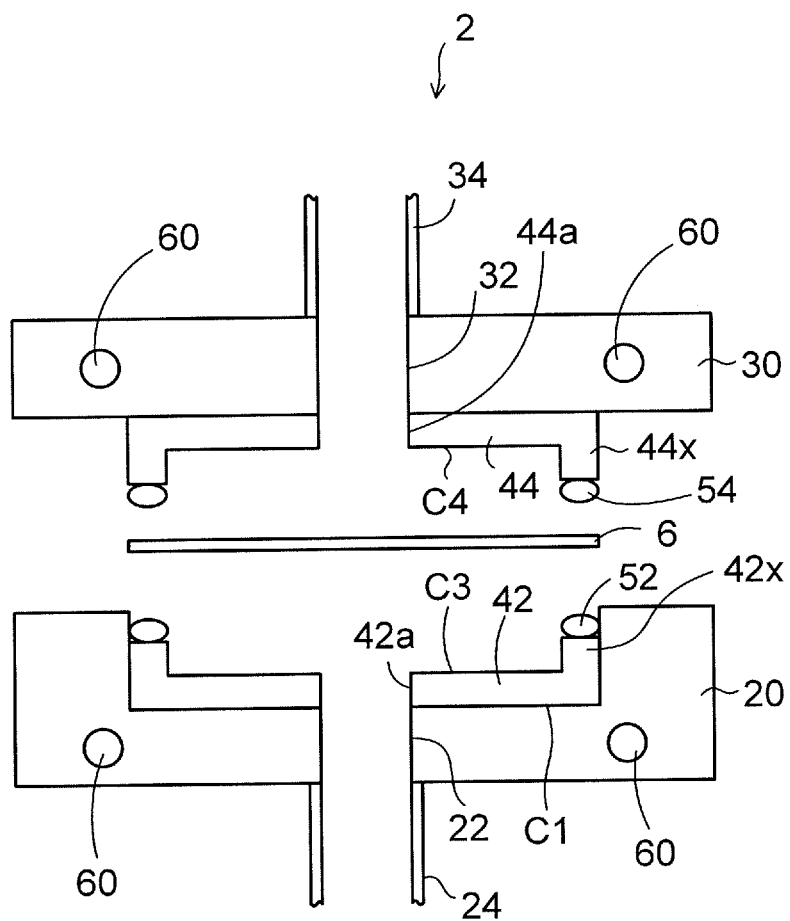
FIG. 16 is a cross-sectional view depicting a substrate warp correcting device of a second embodiment.
Figure 17:
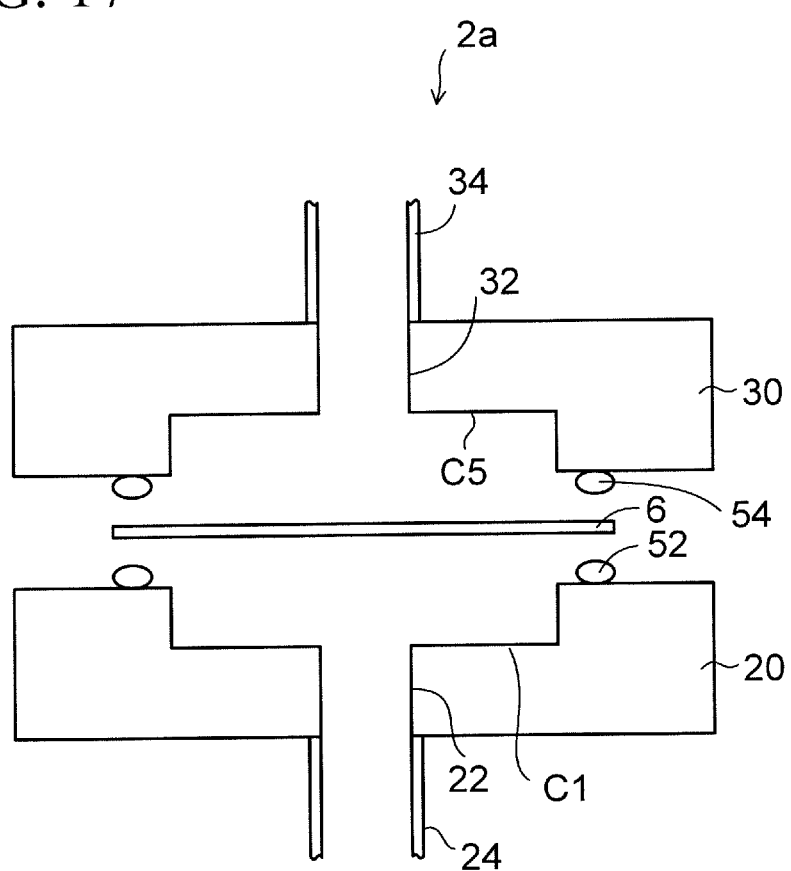
FIG. 17 is a cross-sectional view depicting a substrate warp correcting device of a modification of the second embodiment.
Figure 18:
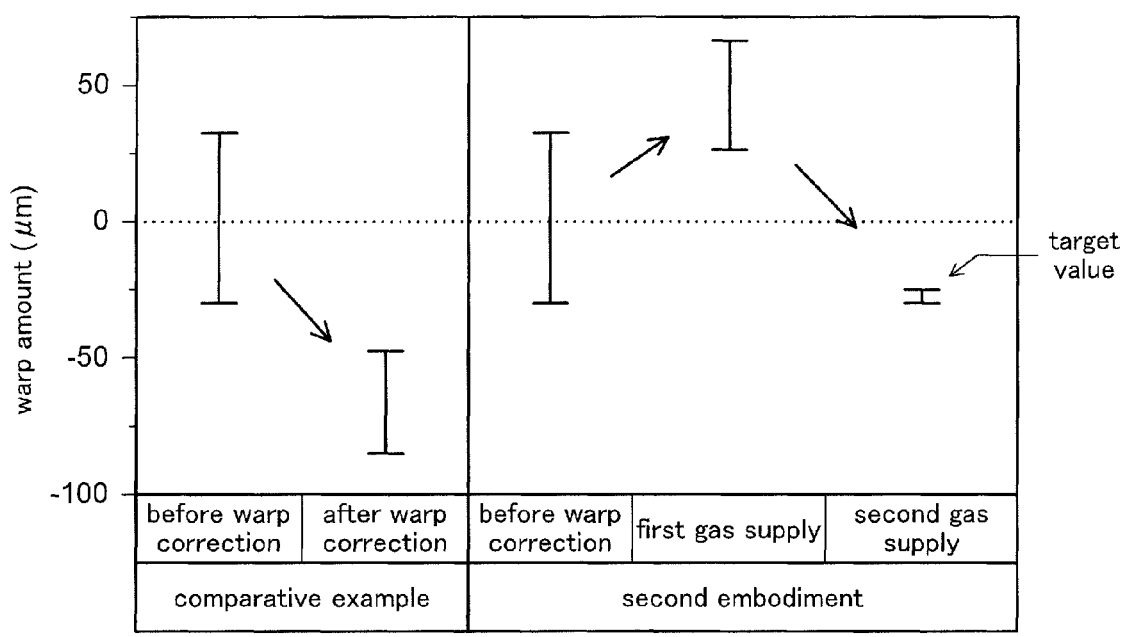
FIG. 18 is a view depicting a method of supplying gas in a substrate warp correcting method of the second embodiment.

FIGS. 16 and 17 are cross-sectional views depicting a substrate warp correcting device of a second embodiment. FIGS. 18 and 19 are views for explaining a substrate warp correcting method of the second embodiment.

The substrate warp correcting devices 1, 1a of the first embodiment mentioned above can correct a substrate warped in the convex shape to the concave shape since the gas supplying hole 32 is formed in the upper member 30.

However, in a case that there are not only substrates warped in the convex shape but also substrates warped in the concave shape, when correcting the substrate warped in the concave shape, further the warp is caused toward the concave side and it is in a situation of the excessive correction. Thus, satisfactory quality cannot be achieved.

In view of this, in the second embodiment, a gas supplying hole is formed also in the lower member of the substrate warp correcting device so that the substrate can be corrected not only from the front face side but also from the back face side.

As depicted in FIG. 16, a substrate warp correcting device 2 of the second embodiment includes a lower member 20 and an upper member 30 arranged thereon. A quadrangle concave portion C1 is formed in a center part of the upper face side of the lower member 20.

Moreover, a gas supplying hole 22 is formed in the center of the bottom face of the concave portion C1 of the lower member 20, the gas supplying hole 22 penetrating the lower member 20 in the thickness direction and connected to the concave portion C1. A gas pipe 24 is attached to the gas supplying hole 22 in the lower member 20, and gas is supplied from a gas compressor (not depicted) at a predetermined pressure.

A lower spacer 42 having an opening portion 42a is arranged on the inner face of the concave portion C1 of the lower member 20, and the opening portion 42a is provided on the gas supplying hole 22 in the lower member 20. The lower spacer 42 has an annular protruding portion 42x protruding upward along the sidewall of the concave portion C1 of the lower member 20.

By this matter, a concave portion C3 located along the concave portion C1 of the lower member 20 is formed on the inner face of the lower spacer 42a. Moreover, an annular lower sealing member 52 is arranged on the upper face of the protruding portion 42x of the lower spacer 42.

Moreover, the upper member 30 is in a flat plate shape, and a gas supplying hole 32 penetrating in the thickness direction is formed in a center part thereof. An upper spacer 44 having an opening portion 44a is arranged on the lower face of the upper member 30, and the opening portion 44a is provided under the gas supplying hole 32.

The upper spacer 44 is formed to include an annular protruding portion 44x protruding downward so as to correspond to the protruding portion 42x of the lower spacer 42. By this matter, a concave portion C4 is formed on the inner face of the upper spacer 44.

An annular upper sealing member 54 is arranged on the lower face of the protruding portion 44x of the upper spacer 44.

A gas pipe 34 is attached to the gas supplying hole 32 in the upper member 30, and gas is supplied from a gas compressor (not depicted) at a predetermined pressure.

Note that, as each of the lower spacer 42 and the upper spacer 44A, the spacer in which the main body thereof is formed in the annular shape may be used like the annular spacer 40 in FIGS. 5 and 6 of the first embodiment.

Then, a substrate 6 to be subjected to warp correction is arranged between the lower member 20 and the upper member 30. A heater 60 is provided in each of the lower member 20 and the upper member 30, and is capable of heating the wiring substrate 6 to a desired temperature.

In this way, in the substrate warp correcting device 2 of the second embodiment, not only the gas supplying hole 32 is formed in the upper member 30, but also the gas supplying hole 22 is formed in the lower member 20. Thus, the warp of the wiring substrate 6 can be corrected by supplying the gas from both the front face side and the back face side of the substrate 6. By this matter, in the case that the substrate 6 is warped in the convex shape, the warp can be corrected to concave warp of a desired amount by supplying gas from the gas supplying hole 32 of the upper member 30.

Also conversely, in the case that the substrate 6 is warped excessively large in the concave shape, the concave warp can be corrected toward the convex side so as to obtain a desired warp amount of the concave shape by supplying gas from the gas supplying hole 22 of the lower member 20.

FIG. 17 depicts a substrate warp correcting device 2a of a modification of the second embodiment. Like the substrate warp correcting device 2a of the modification in FIG. 17, the lower spacer 42 and the upper spacer 44 in FIG. 16 may be omitted.

In the case of this mode, the lower sealing member 52 is arranged on the upper face of the lower member 20 around the concave portion C1. Moreover, a concave portion C5 is formed on the lower face side of the upper member 30, and the upper sealing member 54 is arranged on the lower face around the concave portion C5. In this way, both faces of the periphery part of the substrate 6 is adhered to the lower member 20 and the upper member 30 through the lower sealing member 52 and the upper sealing member 54.

FIG. 18 is a view depicting a comparison between a warp correcting method of a comparative example and the warp correcting method of the second embodiment.

In the comparative example, a warp correcting device including a gas supplying hole only in its upper member is used. As depicted in FIG. 18, in both cases of the warp correcting methods of the comparative example and the second embodiment, the warp amounts of a plurality of substrates 6 before warp correction are in a range of +30 μm to −30 μm, and both convex warp (positive values) and concave warp (negative values) exist to be mixed.

In the case of the substrate warp correcting device of the comparative example, because the gas supplying hole is provided only in the upper member, the warp can be corrected only toward the concave side. For this reason, when the warp correcting process is performed to each substrate, the warp amounts of the plurality of substrates 6 shift to the warp amounts in a range of −50 μm to −80 μm. Thus, some substrates are excessively corrected toward the concave side, and it cannot satisfy the quality.

Figure 19A:
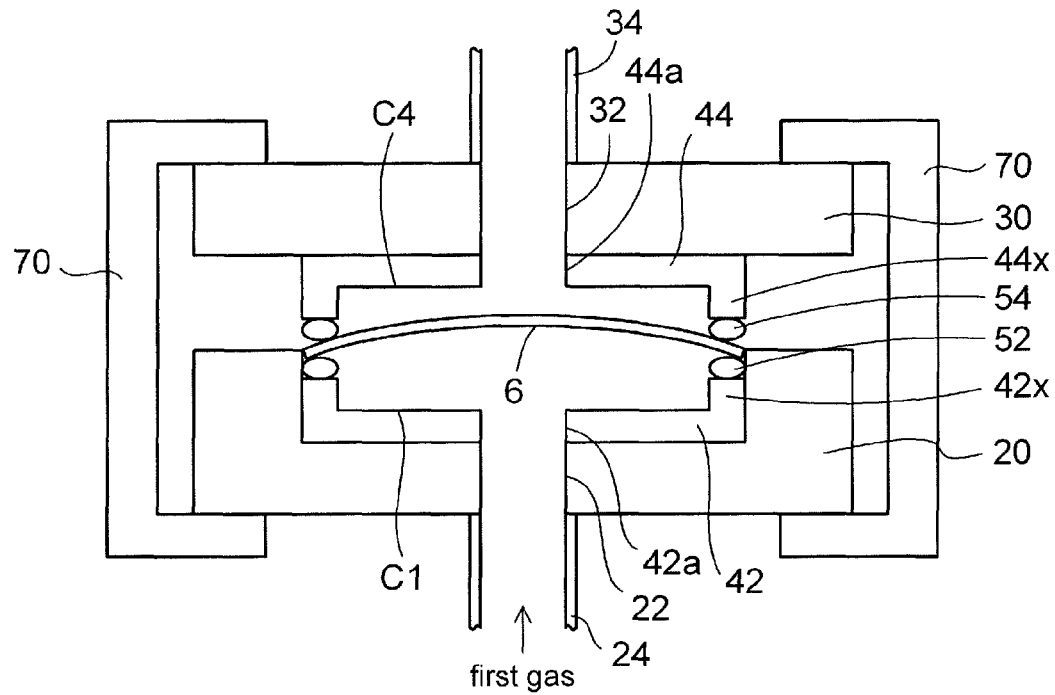
FIGS. 19A and 19B is a cross-sectional view depicting a method of correcting the substrate by using the substrate warp correcting device of the second embodiment.

On the other hand, in the case of the substrate warp correcting device 2 of the second embodiment, referring to add FIG. 19A, first, the first gas is supplied at a predetermined pressure to the back face of each substrate 6 from the gas supplying hole 22 of the lower member 20. By this matter, as depicted in FIG. 18, the warp amounts of the plurality of substrates 6 shift to a range of +25 μm to +60 μm. Thus, the warp amounts of the plurality of substrates 6 become the warp amounts inverse to target value (about −25 μm) of the warp amount.

Figure 19B:
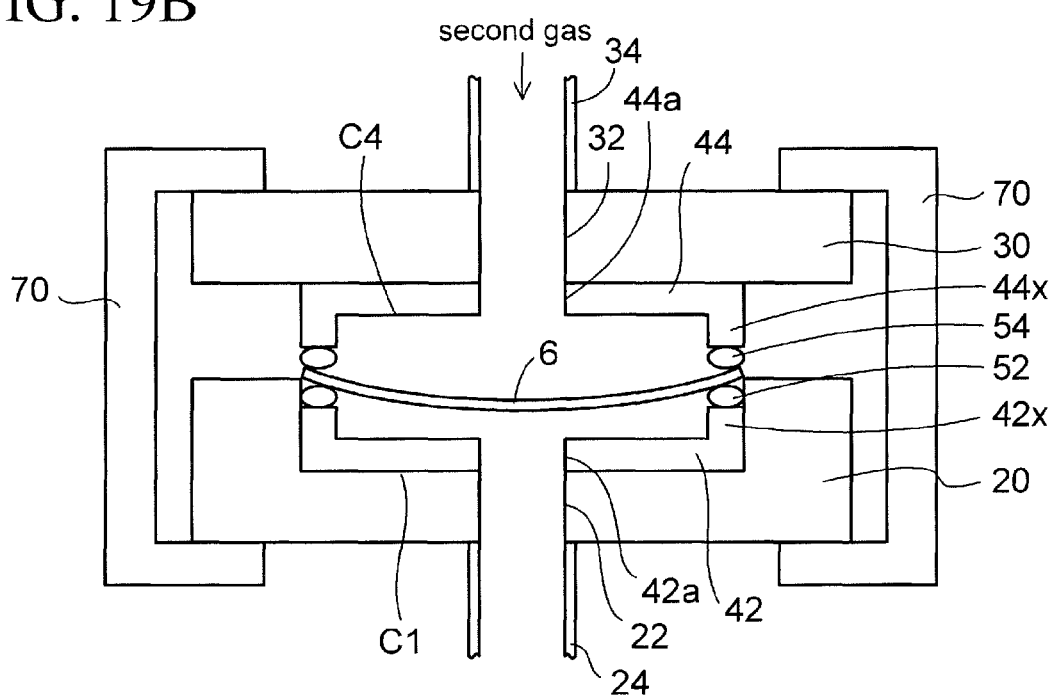

Then, referring to add FIG. 19B, the second gas is supplied at a predetermined pressure to the front face of each substrate 6 from the gas supplying hole 32 of the upper member 30. By this matter, as depicted in FIG. 18, the warp amounts of the plurality of substrates 6 shift to values about −25 μm and can therefore be adjusted to the target value of the warp amount.

The warp amounts of the plurality of substrates 6 vary in the range of +25 μm to +60 μm after the first gas is supplied. Therefore, the pressure of the second gas, the processing time, and the like are adjusted for each substrate 6 so that the warp amounts thereof become the value about −20 μm.

In this way, a plurality of substrates 6 in which the warp of the convex shape and the warp of the concave shape are mixed are once processed so as to be warped in the convex shape and thereafter are corrected so as to be warped in the concave shape. Thus, the warp amount of the plurality of substrates 6 can be set within a range of the desired amount of the concave warp.

Besides this example, for example, as to the substrate which is warped excessively large in the concave shape, first, the warp in the concave shape of the substrate is corrected to about zero by supplying the first gas from the gas supplying hole 22 of the lower member 20, and then the warp amount of the substrate 6 may be set to the concave warp amount of the target value by supplying the second gas from the gas supplying hole 32 of the upper member 30.

Alternatively, the gas may be simultaneously supplied from the gas supplying hole 32 of the upper member 30 and the gas supplying hole 22 of the lower member 20. In this case, the pressures of the gases supplied from the upper and lower sides are set differently, thereby the difference between the pressures of the gases from the upper and lower sides serves as the warp correction pressure of the substrate 6. Therefore, the adjustment of the subtle pressure is enabled, and the warp of the substrate 6 can be corrected accurately.

Further, it may repeat with many times the step of supplying gas alternately from the gas supplying hole 32 of the upper member 30 and the gas supplying hole 22 of the lower member 20.

In this way, in the substrate warp correcting device 2 of the second embodiment, the gas for correcting the warp can be supplied from both sides of the upper member 30 side and the lower member 20 side. As the result, by supplying gas to both faces of the substrate 6 at various timings, it is possible to correct the substrate 6 not only toward the concave side but also toward the convex side and also to accurately adjust the substrate 6 to a desired warp amount.

Moreover, as a method of adjusting the correcting force to be applied to the substrate 6, there is a method to change the each size of the concave portions C1, C4 of the lower spacer 42 and the upper spacer 44.

Figure 20A:
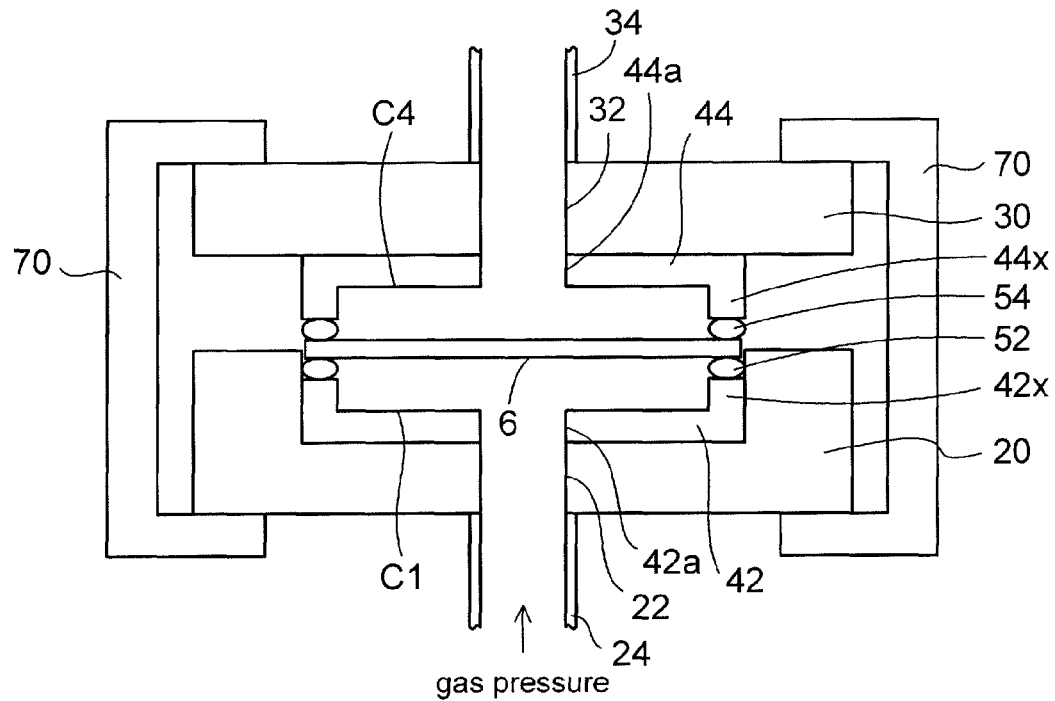
FIGS. 20A and 20B is a cross-sectional view depicting a method of adjusting a pressure which is applied to the substrate in the substrate warp correcting device of the second embodiment.

In FIG. 20A, the outermost peripheral part of the substrate 6 is clamped by the lower sealing member 52 and the upper sealing member 54 similarly to FIG. 16 mentioned above.

Figure 20B:
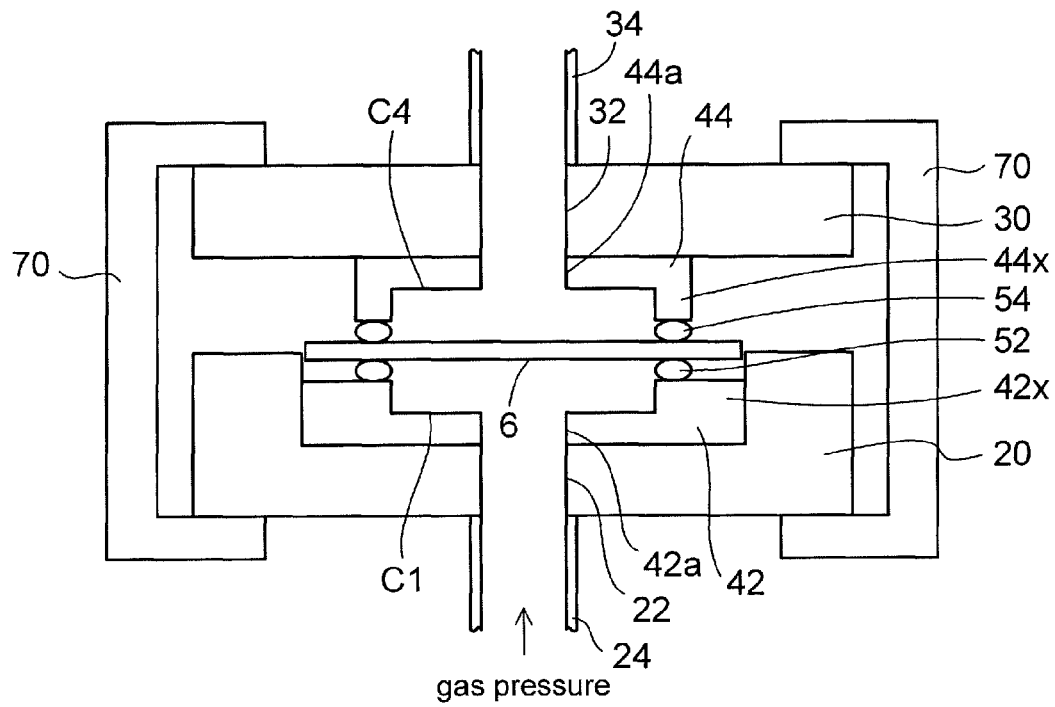

In contrast, as depicted in FIG. 20B, the each size of the concave portions C1, C4 of the lower spacer and the upper spacer 44 is reduced, thereby the distance between the protruding portion 42x of the lower spacer 42 are set to be small and the distance between the protruding portion 44x of the upper spacer 44 are set to be small. By this matter, a part near the center side of the substrate 6 can be clamped by the lower sealing member 52 and the upper sealing member 54.

In the structure in FIG. 20B, even if the same gas pressure as the gas pressure in FIG. 20A is applied, the deformation amount of the substrate 6 can be smaller than the deformation amount of the substrate 6 in FIG. 20A. Therefore, the correcting force to be applied to the substrate 6 can be adjusted small.

In a general compressor, when low gas pressure is applied, the gas pressure tends to be unstable. Thus, the correction accuracy can be improved by using various kinds of pressure adjusting methods together.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A substrate warp correcting device, comprising:
   a lower member including a concave portion, and the lower member on which a substrate is to be arranged;
   an upper member arranged above the lower member, and the upper member including a gas supplying hole, wherein the substrate is arranged between the lower member and the upper member and above the concave portion; and
   a sealing member arranged between a periphery part of the substrate and the upper member, and the sealing member sealing a space between the substrate and the upper member.

2. The substrate warp correcting device according to claim 1, further comprising a spacer arranged on a periphery part in the concave portion of the lower member, wherein the periphery part of the substrate is arranged on the spacer.

3. The substrate warp correcting device according to claim 1, wherein the periphery part of the substrate is arranged on an outer region of the concave portion of the lower member.

4. The substrate warp correcting device according to claim 1, wherein a concave portion is formed in a lower face of the upper member, and is connected to the gas supplying hole.

5. The substrate warp correcting device according to claim 1, wherein a heater is provided in the lower member and the upper member respectively.

6. The substrate warp correcting device according to claim 1, wherein the lower member includes a gas supplying hole connected to the concave portion, and
   the substrate covers the concave portion of the lower member through a sealing member which seals a space between the substrate and the lower member.

7. A substrate warp correcting method, comprising:
   preparing a lower member including a concave portion;
   preparing an upper member including a gas supplying hole, wherein a substrate is arranged between the lower member and the upper member and above the concave portion, and arranging a sealing member on a periphery part of the substrate, and arranging the upper member above the lower member through the sealing member; and
   supplying gas to the substrate from the gas supplying hole.

8. The substrate warp correcting method according to claim 7, wherein in the arranging of the substrate, a spacer is arranged on a periphery part in the concave portion of the lower member, and the periphery part of the substrate is arranged on the spacer.

9. The substrate warp correcting method according to claim 7, wherein a concave portion is formed in a lower face of the upper member, and is connected to the gas supplying hole.

10. The substrate warp correcting method according to claim 7, wherein the supplying of the gas is performed in a temperature atmosphere of room temperature to 90° C.

11. The substrate warp correcting method according to claim 7, wherein the substrate is a wiring substrate, and
    after the gas is supplied to the wiring substrate to correct a warp of the wiring substrate, a semiconductor chip is flip-chip connected to an upper face of the wiring substrate.

12. The substrate warp correcting method according to claim 7, wherein, in the arranging the substrate between the lower member and the upper member,
    the lower member includes a gas supplying hole connected to the concave portion, and the substrate covers the concave portion of the lower member through a sealing member which seals a space between the substrate and the lower member,
    the supplying gas to the substrate from the gas supplying hole includes to supply the gas to the substrate from the gas supplying hole of the upper member and the gas supplying hole of the lower member.

* * * * *